(12) United States Patent
Lorenz (10) Patent No.: US 6,384,679 B1
(45) Date of Patent: May 7, 2002

(54) RAIL-TO-RAIL AMPLIFIER WITH REDUCED GM AND COMPENSATING CAP

(75) Inventor: Perry Scott Lorenz, Fort Collins, CO (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 09/714,681

(22) Filed: Nov. 15, 2000

(51) Int. Cl.[7] .............................................. H03F 1/14
(52) U.S. Cl. ........................ 330/51; 330/136; 330/285
(58) Field of Search ........................... 330/51, 136, 285

(56) References Cited

U.S. PATENT DOCUMENTS

| | | | | |
|---|---|---|---|---|
| 5,757,229 A | * | 5/1998 | Mitzlaff | 330/124 R |
| 5,936,464 A | * | 8/1999 | Grondahl | 330/10 |
| 6,097,252 A | * | 8/2000 | Sigmon et al. | 330/136 |
| 6,285,239 B1 | * | 9/2001 | Lyer et al. | 327/531 |

* cited by examiner

Primary Examiner—Robert Pascal
Assistant Examiner—Henry Choe
(74) Attorney, Agent, or Firm—Brett A. Hertzberg (57) ABSTRACT

An amplifier employs a first and second input stage amplifier, and an output stage amplifier for rail-to-rail operation. The rail-to-rail amplifier is driven by an input signal with a particular common-mode voltage. The first amplifier is active during a first range of common-mode voltages, while the second amplifier is active during a second range. A monitor circuit includes an input differential pair that operates at the same common-mode voltage as the first input differential pair in the first amplifier. The monitor circuit senses when the first amplifier has reached a condition where the amplifier begins to stop working by monitoring a current flowing in the input differential pair. The monitor circuit controls the bias current in the second amplifier's bias circuit such that the second amplifier is enabled when the current in the monitor circuit input differential pair drops down towards zero. The outputs of the first input stage amplifier and the second input stage amplifier are coupled to the input of the output stage amplifier. Since the first and second input stage amplifiers are not on at the same time, the overall gain in the amplifier is reduced. Reducing the gain of the rail-to-rail amplifier results in a reduced size of a compensation capacitor that is coupled across the input and output of the output stage amplifier. The reduction in gain and compensation capacitor results in a lowered amount of chip space and reduced cost for the rail-to-rail amplifier.

20 Claims, 8 Drawing Sheets

RAIL-TO-RAIL AMPLIFIER WITH REDUCED GM AND COMPENSATING CAP

FIELD OF THE INVENTION

The present invention relates to a method and apparatus for a rail-to-rail amplifier. In particular, the present invention relates to a method and apparatus that uses a rail-to-rail amplifier with a reduced gain, allowing the compensation network to be reduced in size while maintaining suitable stability over the amplifiers operating voltage range.

BACKGROUND OF THE INVENTION

Differential amplifiers normal only operate over a limited range of input voltages. The maximum input voltage range for which a circuit continues to operate as an amplifier is termed the input common-mode range (CMR). When the input voltages (or common mode voltage) exceed the input CMR, transistors become cutoff, saturated, or breakdown in one or more gain stages of the amplifier. Typically, the CMR permits the common mode voltage ($V_{CM}$) to approach within a few volts of either power supply voltage before the amplifier performance is degraded.

Figure 8:
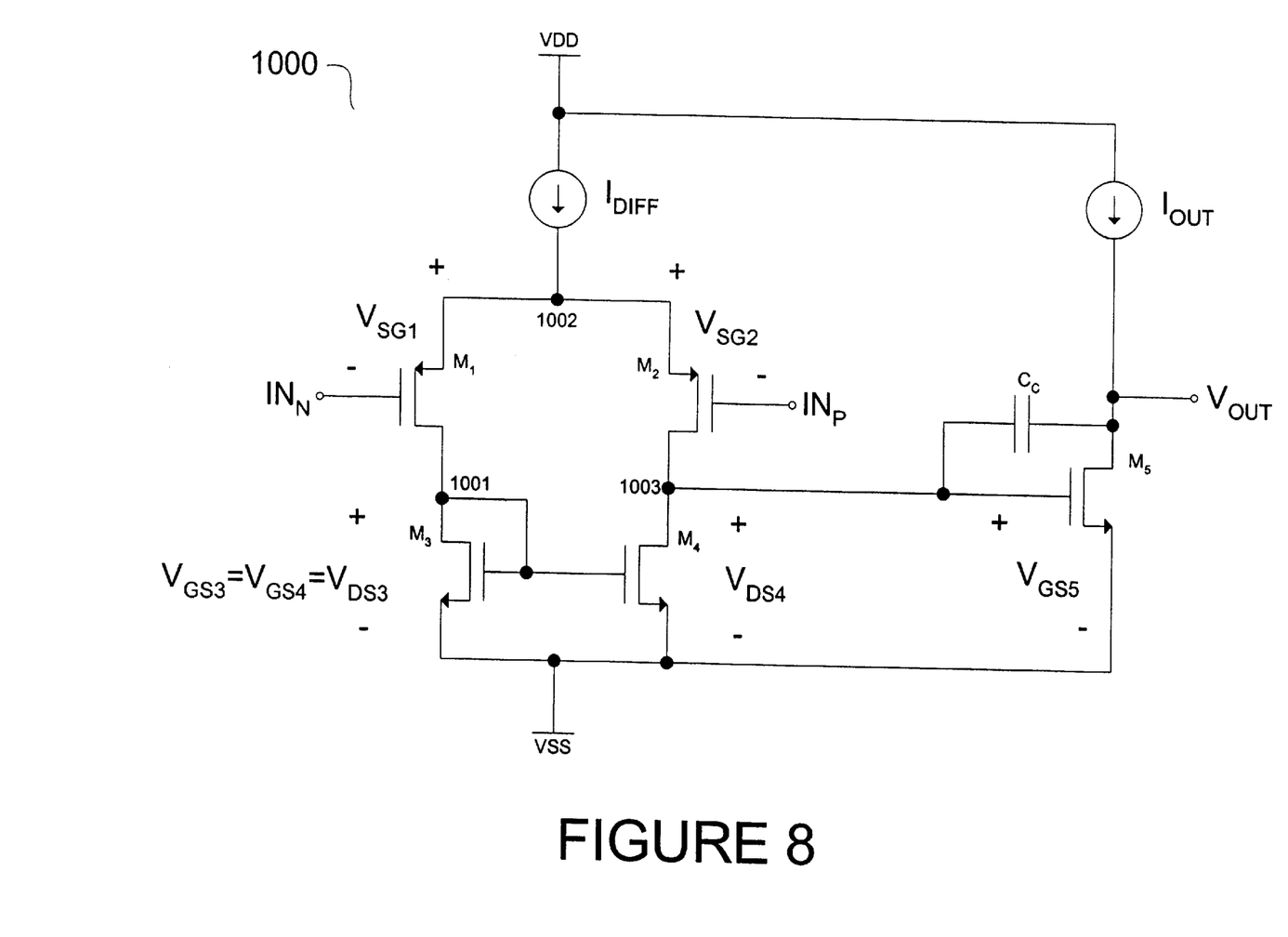
FIG. 8 is an input amplifier.

A typical differential amplifier (100) is shown in FIG. 8. As shown in the figure, a current source $I_{DIFF}$ sources a current into node 1002. Transistor $M_1$ has a source connected to node 1002, a gate connected to $IN_N$ and a drain connected to node 1001. Transistor $M_2$ has a source connected to node 1002, a gate connected to $IN_P$, and a drain connected to node 1003. Transistor $M_3$ is a diode-connected transistor with a gate and drain connected to node 1001, and a source connected to $V_{SS}$. Transistor $M_4$ has a gate connected to node 1001, a drain connected to node 1003, and a source connected to $V_{SS}$. Transistor $M_5$ has a gate connected to node 1003, a drain connected to $V_{OUT}$ and a source connected to $V_{SS}$. A second current source $I_{OUT}$ sources a current into the drain of transistor $M_5$ ($V_{OUT}$). A capacitor ($C_C$) is connected between $V_{OUT}$ and node 103.

Transistors $M_1$ and $M_2$ are a matched pair of PMOS transistors that form a differential input stage of the differential amplifier (1000). Transistors $M_3$ and $M_4$ form an NMOS current mirror, acting as a load for the differential input pair ($M_1$, $M_2$). Current source $I_{DIFF}$ supplies a "tail current" to bias the differential input pair transistors into their active region of operation. NMOS transistor $M_5$ serves as an amplifier, with an input at node 1003 and an output at $V_{OUT}$. A capacitor ($C_C$) reduces the gain of the amplifier at high frequencies to provide a stable amplifier by Miller compensation.

The input differential pair transistors ($M_1$, $M_2$) limit the CMR of differential amplifier 1000. Transistors $M_1$ and $M_2$ must be biased in saturation for the amplifier to function properly. A typical threshold voltage of a PMOS transistor ($V_{TP}$) is on the order of −1V. To remain in saturation, the source-to-gate voltage ($V_{SG}$) of transistors $M_1$ and $M_2$ must be biased active ($V_{SG} \geq |V_{TP}|$). Since the input differential pair transistors will be cutoff when $V_{CM}$ (the DC level at INM and INP) approaches the $V_{DD}$ power supply, the input differential pair transistors will operate as an amplifier when: $V_{G1}$ (max)=$V_{G2}$ (max)=$V_{CM}$ (max)≅$V_{DD}$−|$V_{TP}$|. The active load transistors ($M_3$, $M_4$), together with the input differential pair transistors ($M_1$, $M_2$) determine the minimum $V_{CM}$ for which the amplifier will operate properly. Transistors $M_1$ and $M_2$ must also have a source-to-drain voltage ($V_{SD}$) that exceeds the saturation voltage ($V_{SD} \geq V_{SG}−|V_{TP}|$). The typical threshold voltage of a NMOS transistor ($V_{TN}$) is on the order of +1V. The load transistors M3, M4 must be biased active ($V_{GS3}=V_{GS4}>V_{TN}$). The minimum $V_{CM}$ for amplifier 1000, is determined by: $V_{G1}$ (min) =$V_{G2}$ (min)=$V_{CM}$ (min) ≅$V_{SS}$+$V_{TN}$−|$V_{TP}$|. Thus, amplifier 1000 does not operate as a rail-to-rail amplifier.

The unity-gain bandwidth (GBW) is defined as the frequency where the gain is 0 dB. Since $C_C$ creates a dominant pole in the amplifier, the unity gain bandwidth (GBW) is $\omega \cong g_m/C_C$, where $g_m$ is the trans-conductance of the amplifier.

SUMMARY OF THE INVENTION

In accordance with the invention, the above and other problems are solved by an apparatus and method that reduces an overall gain in a rail-to-rail amplifier. The reduced overall gain permits employment of a reduced size compensation network in compensating the apparatus, and thereby reduces the "on-chip" area used by the compensation network.

Briefly stated, the present invention relates to a rail-to-rail amplifier having a first and second input stage amplifier, and an output stage amplifier that provides rail-to-rail operation. The rail-to-rail amplifier is driven by an input signal with a particular common-mode voltage. The first amplifier is active during a first range of common-mode voltages, while the second amplifier is active during a second range. A monitor circuit includes an input differential pair that is sized to operate at the same common-mode voltages as the first input differential pair in the first amplifier. The monitor circuit senses when the first amplifier has reached a condition where the amplifier begins to stop working by monitoring a current flowing in the input differential pair. The monitor circuit controls the bias current in the second amplifier's bias circuit such that the second amplifier is enabled when the current in the input differential pair drops down towards zero. The outputs of the first input stage amplifier and the second input stage amplifier are coupled to the input of the output stage amplifier. Since the first and second input stage amplifiers are not on at the same time, the overall gain in the amplifier is reduced. Reducing the gain of the rail-to-rail amplifier results in a reduced size of a compensation capacitor that is coupled across the input and output of the output stage amplifier. The reduction in gain and compensation capacitor results in a lowered amount of chip space and reduced cost for the rail-to-rail amplifier.

According to a feature of the invention, an apparatus for amplifying a signal includes a first and second input stage amplifier, and an input amplifier monitor circuit. The input amplifier monitor circuit senses an operating state of at least one of the input stage amplifiers to produce a control signal. The control signal is used to control one of the input stage amplifiers such that the overall gain of the apparatus is limited.

In one embodiment of the invention, the first input stage amplifier operates over a first range of common-mode voltages. The gain is limited by disabling the second amplifier when the first input stage amplifier is operating.

In another embodiment of the invention, the apparatus further includes a controller circuit. The controller circuit disables the second amplifier in response to the control signal when the common-mode voltage is in a first range. The controller circuit enables the second amplifier in response to the control signal when the common-mode voltage is in a second range.

In a further embodiment of the invention, the apparatus further includes a controlled bias circuit that has a bias output. The bias output is coupled to the second input stage amplifier. The controlled bias circuit selectively disables the second input stage amplifier by disabling the bias output in response to the control signal.

In another embodiment of the invention, the first input stage amplifier has a first differential input pair of transistors. The input amplifier monitor circuit includes a second differential input pair of transistors. The transistors of the first differential input pair and the second differential input pair are of a same type (e.g. PMOS). When the second differential input pair is operating at a common-mode voltage in a first range, the second input stage amplifier is disabled by the control signal. Also, the first differential input pair and the second differential input pair may share a common source connection.

In yet another embodiment of the invention, the first and second input stage amplifiers are trans-conductance amplifiers having first and second outputs respectively. The first and second outputs are coupled to a common node. Also, a compensation network may be coupled to the common node, such that the compensation network compensates the gain of the apparatus (e.g. limits the gain). The compensation network normally includes a capacitor. By limiting the gain of the apparatus, the size of the capacitor in the compensation network is also reduced.

In an embodiment of the invention, the input amplifier monitor circuit includes a current sense circuit and a differential pair of transistors. The current sense circuit produces a control signal that is responsive to current flowing in the differential pair of transistors.

Another embodiment of the invention includes a bias circuit that cooperates with an input amplifier monitor circuit. The bias circuit produces a bias voltage that is coupled to the second input stage amplifier. The bias voltage disables the second input stage amplifier when the first amplifier is operating. The bias circuit may further include a first current source, a second current source and a current sense circuit. The first current source generates a first current. The second current source is controlled by the control signal, and generates a second current. The current sense circuit senses a difference between the first current and the second current to produce the bias voltage.

In yet another embodiment of the invention, the input amplifier monitor circuit includes a current monitor circuit. The current monitor circuit monitors a sample current from at least one of the first input stage amplifier and the second input stage amplifier. The sample current is related to the control signal. The sample current changes as the input common-mode voltage approaches a power supply voltage. The control signal changes when the sample current changes such that the first input stage amplifier is gradually disabled and the second input stage amplifier is gradually enabled. By enabling and disabling the second input stage amplifier, the overall gain of the apparatus does not increase.

Another embodiment of the invention relates to a method for amplifying a signal. In operation, the method provides for gaining the signal with an amplifier and another amplifier to produce an output and another output respectively. The method also includes combining the output and the other output to produce another signal that is amplified to produce an amplified signal. By disabling the other amplifier when the signal is in a common-mode voltage range where the amplifier is operable, the overall gain from the signal to the amplified signal is reduced. By enabling the other amplifier when the signal is in another common-mode voltage range where the amplifier is inoperable, rail-to-rail operation is provided. Also, compensating the overall gain is achieved by coupling a compensation network between the other signal and the amplified signal. Furthermore, disabling the other amplifier may include sensing the condition of the amplifier to produce a control signal, and disabling a bias current in the other amplifier in response to the control signal. By disabling the bias current, the other amplifier is disabled.

According to yet another embodiment of the invention, an apparatus for amplifying a signal includes a first and second means for amplifying the signal, means for sampling a current in the first means for amplifying, means for disabling the second means for amplifying when the current is in a first range, and means for enabling the second means for amplifying when the current is in a second range. By enabling and disabling the second means for amplifying an overall gain in the apparatus is reduced. Also, the means for limiting the gain may include a means for compensating, the means for disabling the second means for amplifying, and the means for enabling the second means for amplifying.

A more complete appreciation of the present invention and its improvements can be obtained by reference to the accompanying drawings, which are briefly summarized below, to the following detail description of presently preferred embodiments of the invention, and to the appended claims.

DETAILED DESCRIPTION OF THE PREFERRED EMBODIMENT

The present invention uses a dynamic front-end amplifier to allow rail-to-rail operation in an amplifier, while maintaining a reduced overall gain. Compensation of the amplifier may be performed by coupling a compensation network between the input and output terminals of the output stage amplifier. One factor affecting the size of the compensation network is the total gain of the system. Since the overall gain of the amplifier is reduced, the compensation network may also be reduced in size.

Figure 1:
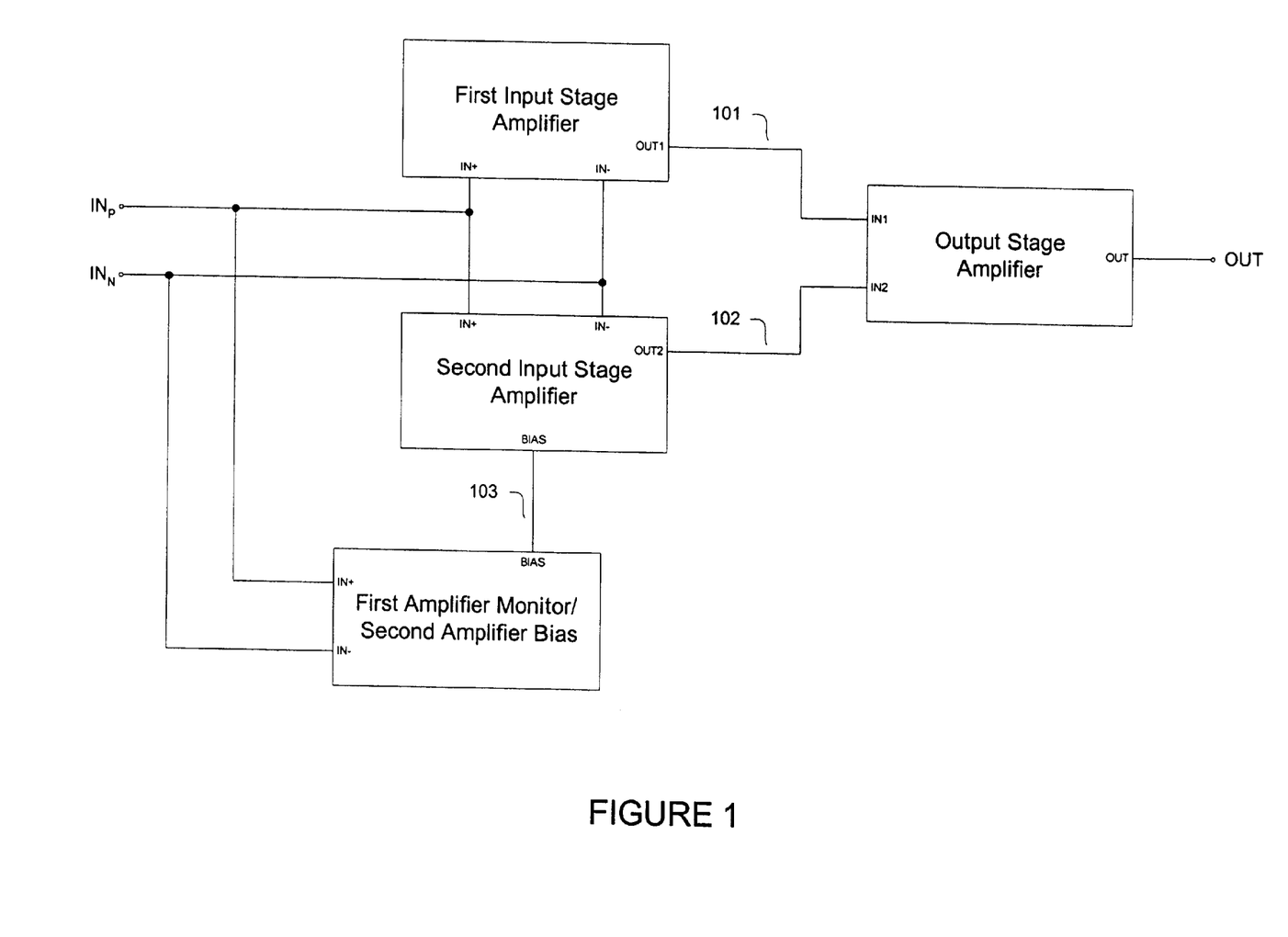
FIG. 1 is a schematic diagram of a rail-to-rail amplifier system.

FIG. 1 shows a schematic of an exemplary rail-to-rail amplifier that is in accordance with the present invention. The figure shows a two-stage differential amplifier that operates-rail to-rail. A differential input signal is applied across input terminals $IN_P$ and $IN_N$. $IN_P$ provides a non-inverting input terminal, while $IN_N$ provides an inverting input terminal. A First Input Stage Amplifier has a differential input (IN+, IN−) coupled to the $IN_P$ and $IN_N$ input terminals, and an output (OUT1) coupled to node 101. A Second Input Stage Amplifier has a differential input (IN+, IN−) coupled to the $IN_P$ and $IN_N$ input terminals, a bias input (BIAS) coupled to node 103, and an output (OUT2) coupled to node 102. A First Amplifier Monitor/Second Amplifier Bias circuit includes a differential input (IN+, IN−) coupled to the $IN_P$ and $IN_N$ input terminals, and a bias output (BIAS) coupled to node 103. An Output Stage Amplifier has an input (IN1) coupled to node 101, another input (IN2) coupled to node 102, and an output (OUT). The First Amplifier Monitor/Second Amplifier Bias generates bias signals for the Second Input Stage Amplifier.

The input amplifiers (First Input Stage Amplifier and Second Input Stage Amplifier) collectively make up the input stage of the rail-to-rail amplifier, providing a total gain on the input stage. The First Input Stage Amplifier is active when the input common-mode voltage is in a first range of operation. The first range of operation ranges from a first power supply voltage (e.g., 0 Volts) to a changeover voltage (e.g. 4 Volts). A second input stage amplifier is disabled in the first range of operation. The second input stage amplifier is enabled when the input common-mode voltage is in a second range of operation. The second range of operation ranges from the changeover voltage to a second power supply voltage (e.g. 5 Volts).

A current in the first input stage amplifier is monitored. When the common-mode voltage of the rail-to-rail amplifier approaches the changeover voltage, the first amplifier begins to cease operating. The first input stage amplifier has at least one transistor in the input stage which must remain biased in order for the amplifier to function properly. When the amplifier's operation approaches the changeover voltage, the transistor (or transistors) cease to have sufficient voltage to remain biased active. The monitoring circuit detects the condition of the first amplifier to determine if the transistors are active. When the monitoring circuit detects the transistors in the first amplifier are approaching inactivity, the second amplifier is activated. By activating the second input stage amplifier, the total gain off the input stage is maintained for rail-to-rail operation.

In a two stage differential amplifier, the input stage amplifier provides a first gain stage, and the output stage amplifier provides a second gain stage. A compensation network is often coupled around the output stage amplifier. The compensation network is often a capacitor (or capacitor and resistor network) that is sized to reduce the AC gain of the system at high frequencies. Since capacitors tend to take up considerable amounts of area in an integrated circuit, it is generally desirable to reduce the size of the compensation network to save "chip area". However, reducing the size of the compensation capacitor increases the GBW ($|A(j\omega)| \cong g_m/(\omega^*C_C)$) and reduces the overall phase margin of the amplifier. By decreasing the trans-conductance ($g_m$) and compensation capacitor ($C_C$) by the same fraction, the GBW and phase margin remains the same.

Figure 2:
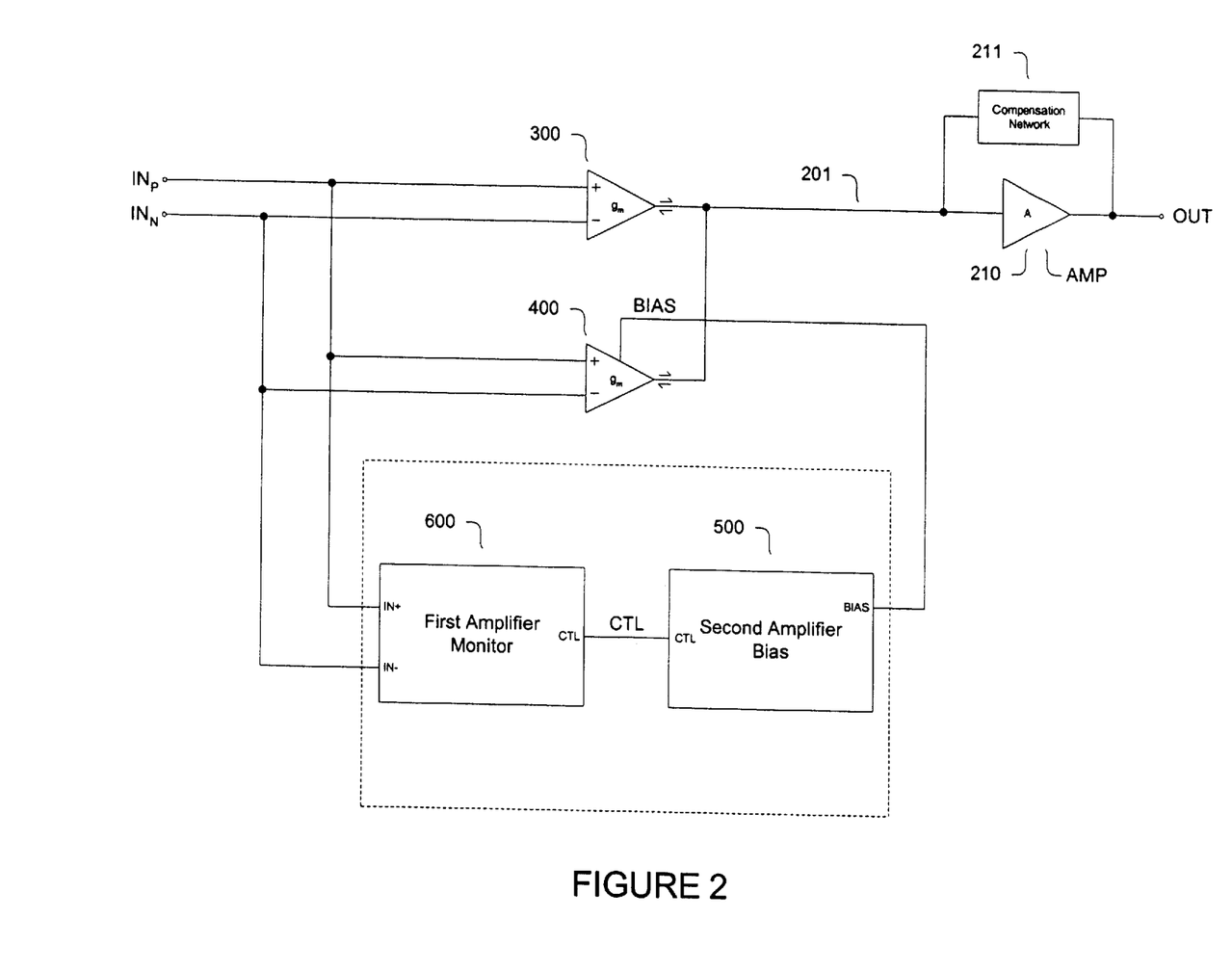
FIG. 2 is a schematic diagram of a rail-to-rail amplifier system with a trans-conductance input amplifier stage.

FIG. 2 shows a more detailed example of a rail-to-rail amplifier that is in accordance with the present invention. In this example, the amplifiers in FIG. 1 are replaced with trans-conductance amplifiers 300 and 400. Trans-conductance amplifier 300 has an output coupled to node 201, and an associated trans-conductance parameter ($g_{m1}$). Trans-conductance amplifier 400 has a bias (BIAS), an output coupled to node 201, and an associated trans-conductance parameter ($g_{m2}$). A first amplifier monitor (600) produces a control signal (CTL) in response to the common-mode input ($IN_P$, $IN_N$). A second amplifier bias (500) produces a bias signal (BIAS) in response to the control signal (CTL). An output stage amplifier (AMP, 210) has an input coupled to node 201 and an output coupled to OUT. A compensation network (211) is coupled between node 201 and OUT. The combination of the input stage amplifiers, the first amplifier monitor, and the second amplifier bias circuit, assists in providing for a rail-to-rail amplifier, where the compensation network is reduced in size.

Figure 3:
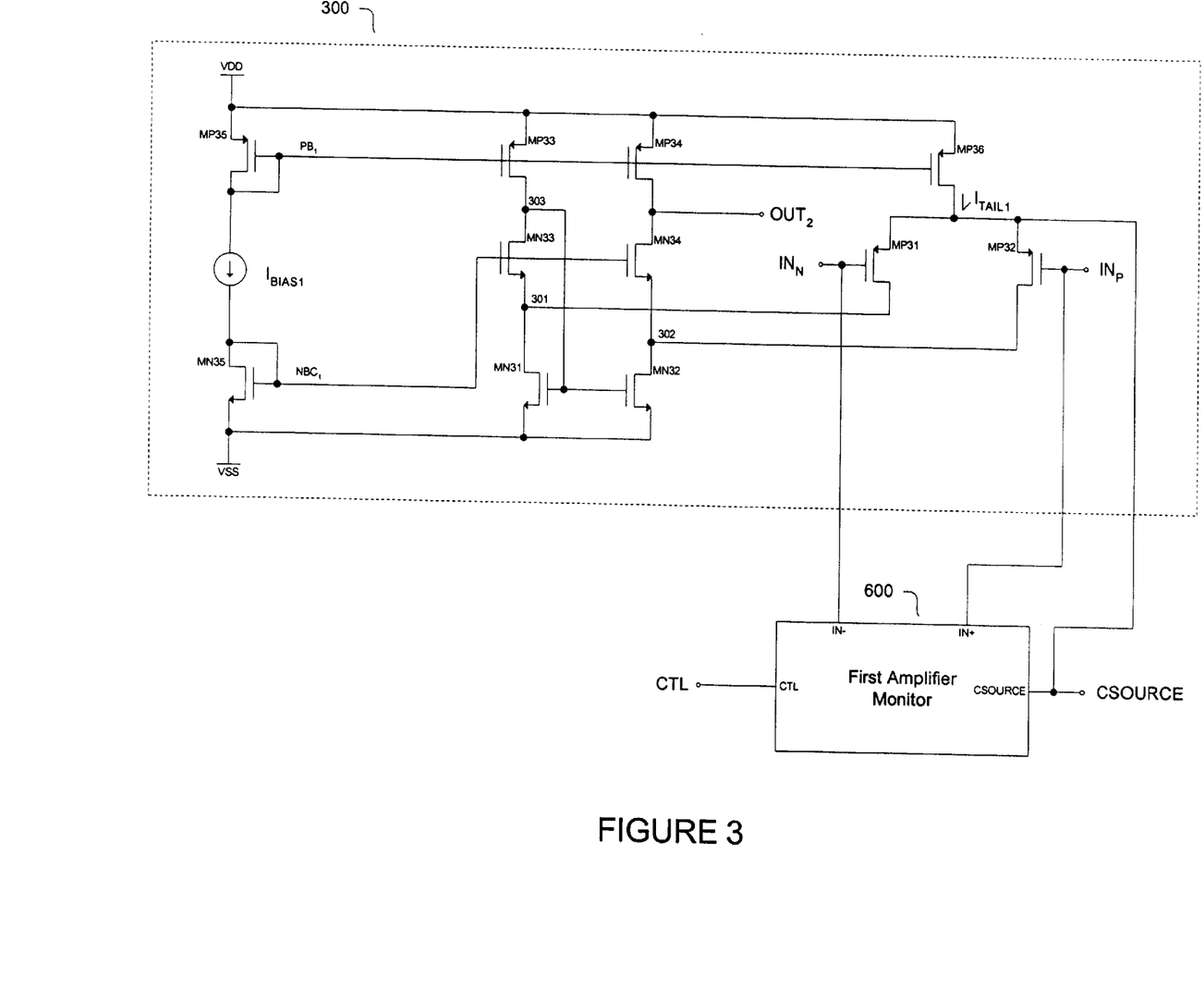
FIG. 3 is a schematic diagram of a first trans-conductance amplifier.

FIG. 3 shows an example of a trans-conductance amplifier (300) with a PMOS differential input stage. PMOS transistors MP31 and MP32 form a differential pair with common sources connected to node CSOURCE. $IN_N$ (the inverting input drives the gate of transistor MN31, while $IN_P$ (the non-inverting input) drives the gate of transistor MN32. A current source transistor (MP36) produces a tail current ($I_{TAIL1}$) that flows into the CSOURCE node. The gate of MP36 is connected to a bias generator circuit that provides bias lines $PB_1$ and $NBC_1$. The bias generator consists of a diode connected PMOS transistor (MP35) series connected to a current source ($I_{BIAS1}$) and a diode connected NMOS transistor (MN35). MP35 has a source connected to $V_{DD}$, and a gate/drain connected to $PB_1$. MN35 has a source connected to $V_{SS}$, and a gate/drain connected to $NBC_1$. Bias connection $PB_1$ is connected to the gate of transistors MP33 and MP34. MP33 has a source connected to $V_{DD}$ and a drain connected to node 303. MP34 has a source connected to $V_{DD}$ and a drain connected to $OUT_2$. Another bias ($NBC_1$) is connected to the gate of NMOS transistors MN33 and MN34. MN33 has a source connected to node 301 and a drain connected to node 303. MN34 has a source connected to node 302 and a drain connected to $OUT_2$. NMOS transistors MN31 and MN32 are configured as a current mirror, having common sources connected to $V_{SS}$, and common gates connected to node 303. MN31 has a drain connected to node 301 while MN32 has a drain connected to node 302. A first amplifier monitor circuit (600) includes a control output signal (CTL), a current source input connected to CSOURCE, and differential inputs (IN+, IN−) connected to $IN_P$ and $IN_N$.

Figure 4:
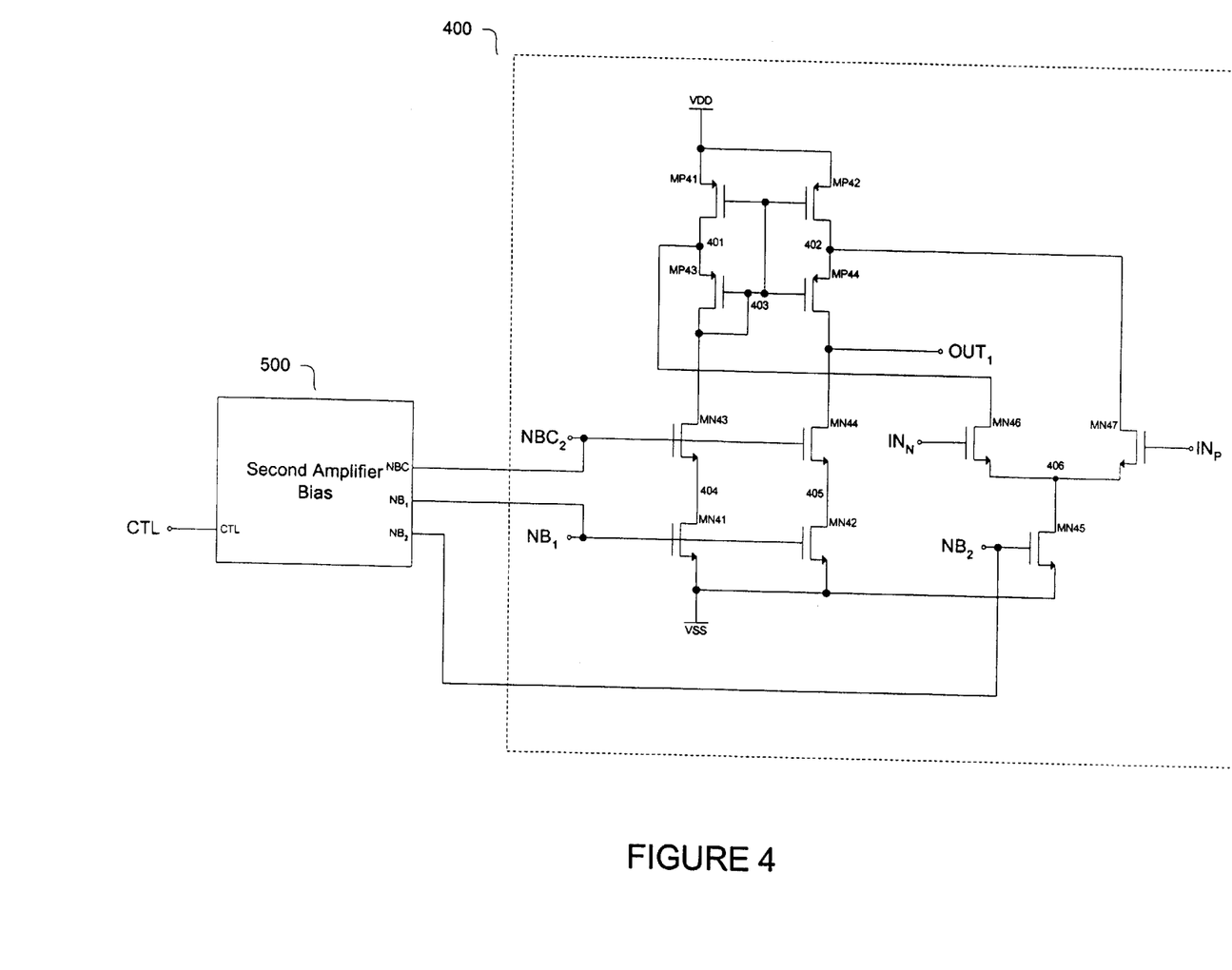
FIG. 4 is a schematic diagram of a second trans-conductance amplifier.

FIG. 4 shows an example trans-conductance amplifier (400) with an NMOS differential input stage. A bias circuit (500) is controlled by a signal (CTL). The control signal (CTL) is generated by the first amplifier monitor circuit (600), which is shown in FIG. 3. Bias circuit (500) provides three bias lines (NB1, $NB_2$, $NBC_2$) for NMOS transistor devices. At least one of the bias lines ($NB_1$, $NB_2$, $NBC_2$) is used to disable the trans-conductance amplifier (400) in response to the control signal (CTL). In one embodiment, the $NB_1$ bias line is coupled to ground to disable amplifier 400. NMOS transistors MN46 and MN47 form an input differential stage in the amplifier. MN46 has a gate connected to $IN_N$, a source connected to node 406, and a drain connected to node 401. MN47 has a gate connected to $IN_P$, a source connected to node 406, and a drain connected to node 402. An NMOS transistor (MN45) forms a current source with a gate connected to $NB_2$, a source connected to $V_{SS}$, and a drain connected to node 406. An NMOS transistor (MN41) forms a current source having a gate connected to $NB_1$, a source connected to $V_{SS}$, and a drain connected to node 404. NMOS transistor MN43 forms a cascode current source having a gate connected to $NBC_2$, a source connected to node 404, and a drain connected to node 403. NMOS transistor MN42 forms another current source having a gate connected to $NB_1$, a source connected to $V_{SS}$, and a drain connected to node 405. NMOS transistor MN44 forms another cascode current source having a gate connected to $NBC_2$, a source connected to node 305, and a drain connected to $OUT_1$. PMOS transistor MP41 forms an active load with a source connected to $V_{DD}$, a gate connected to node 403, and a drain connected to node 401. PMOS transistor MP43 is a diode-connected transistor, with a gate and drain connected to node 403, and a source connected to node 401. PMOS transistor MP44 is a mirror device with a gate connected to node 403, a source connected to node 402 and a drain connected to $OUT_1$.

The First Amplifier Monitor circuit (600, see FIG. 3) is connected to the differential inputs $IN_P$ and $IN_N$. The control signal (CTL) controls BIAS circuit (500, see FIG. 4) in response to the input common mode voltage. The output bias control lines from BIAS (500) will change based on the control signal (CTL). Although the first amplifier monitor circuit (600) is connected to CSOURCE in the PMOS input stage trans-conductance amplifier, the common mode sense can be adapted to function properly with an NMOS input stage amplifier, or other type of amplifier using the same principles disclosed herein.

Figure 5:
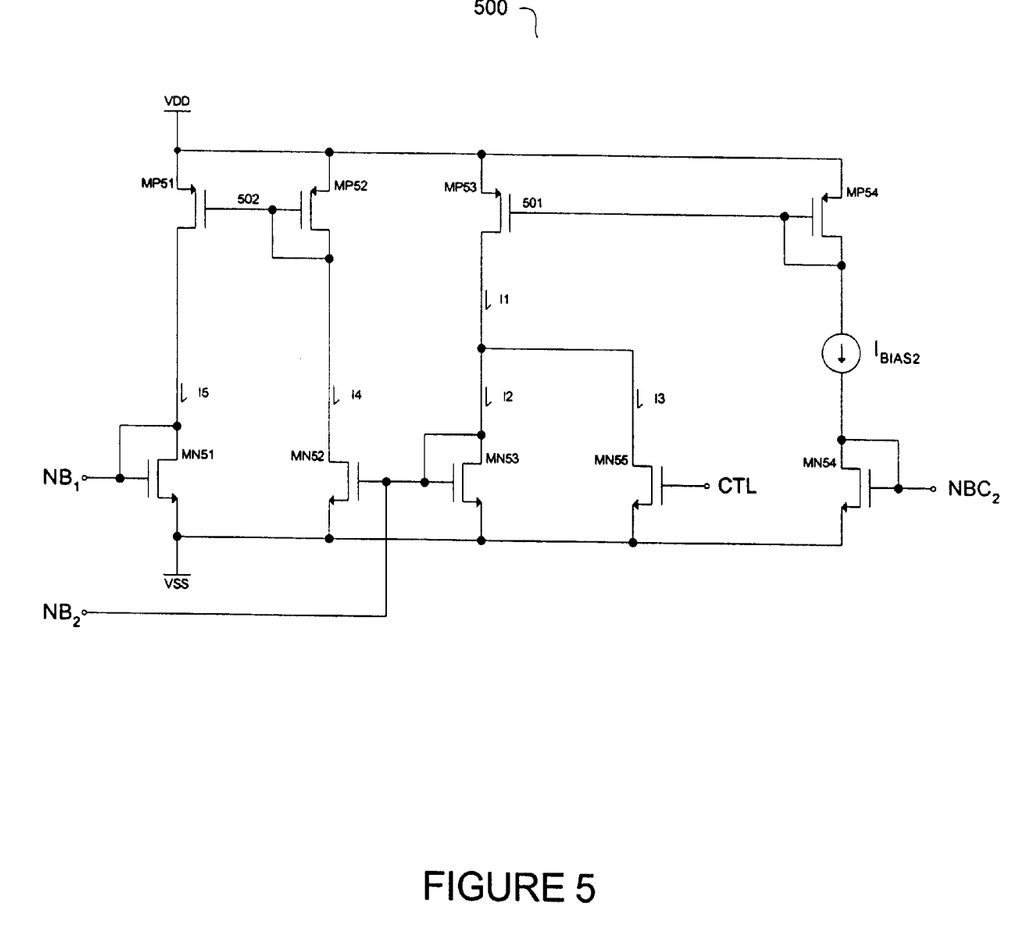
FIG. 5 is a schematic diagram of a bias generator used by the second trans-conductance amplifier shown in FIG. 4.

FIG. 5 shows an example of a biasing circuit in accordance with an embodiment of the present invention. A bias current ($I_{BIAS2}$) is provided between nodes 501 and $NBC_2$. Bias current $I_{BIAS2}$ may be provided by a band-gap reference circuit, an externally generated bias current, an on-chip resistor, or any other suitable current reference as is needed. NMOS transistor MN54 is a diode-connected transistor, with a source connected to $V_{SS}$, a drain and gate connected to $NBC_2$, and conducting bias current $I_{BIAS2}$. PMOS transistor MP54 is a diode-connected transistor, with a source connected to $V_{DD}$, a drain and gate connected to node 501, and conducting bias current $I_{BIAS2}$. A PMOS transistor MP53 is a current mirror with a source connected to $V_{DD}$, a drain connected to $NB_2$ and a gate connected to node 501. An NMOS transistor (MN53) has a gate and drain connected to $NB_2$ and a source connected to $V_{SS}$. NMOS transistor MN55 has a gate connected to control signal CTL, a drain connected to $NB_2$ and a source connected to $V_{SS}$. NMOS transistor MN52 is a current mirror with a drain connected to node 502, a gate connected to $NB_2$, and a source connected to $V_{SS}$. PMOS transistor MP52 has a drain and gate connected to node 502, and a source connected to $V_{DD}$. PMOS transistor MP51 is a current mirror, with a drain connected to node $NB_1$, a gate connected to node 502 and a source connected to $V_{DD}$. NMOS transistor MN51 has a gate and drain connected to node $NB_1$, and a source connected to $V_{SS}$.

Transistor MP53 provides a first current (I1) in the bias circuit. MN53 is a diode-connected transistor that conducts a second current (I2) when active. Transistor MN55 is a controlled transistor that conducts a third current (I3) based on the control input (CTL). The total current in transistor MP53 is given by I1=I2+I3. Transistor MN52 is a current mirror, conducting a fourth current (I4) that is proportional to I2. Similarly, transistor MN51 is a current mirror that conducts a fifth current (I5) that is proportional to I4. Since transistor MN55 has a gate connected to the control signal (CTL), and the total current (I1) is divided between the two transistors (MN53 and MN55), the control signal (CTL) can change I2 from 0% to 100% of I1. When I2 is zero (I1=I3), the bias connection $NB_2$ drops to $V_{SS}$. Since bias connection $NB_2$ is at $V_{SS}$, I4 drops to zero causing I5 to also drop to zero, and resulting in bias connection $NB_1$ dropping to $V_{SS}$. Thus, any NMOS transistors that are connected to NBand $NB_2$ can be disabled with the CTL control line. The sizes of transistors MN53 and MN55 determine the amount of signal required on CTL to disable the NMOS bias lines ($NB_1$, $NB_2$) will change.

Figure 6:
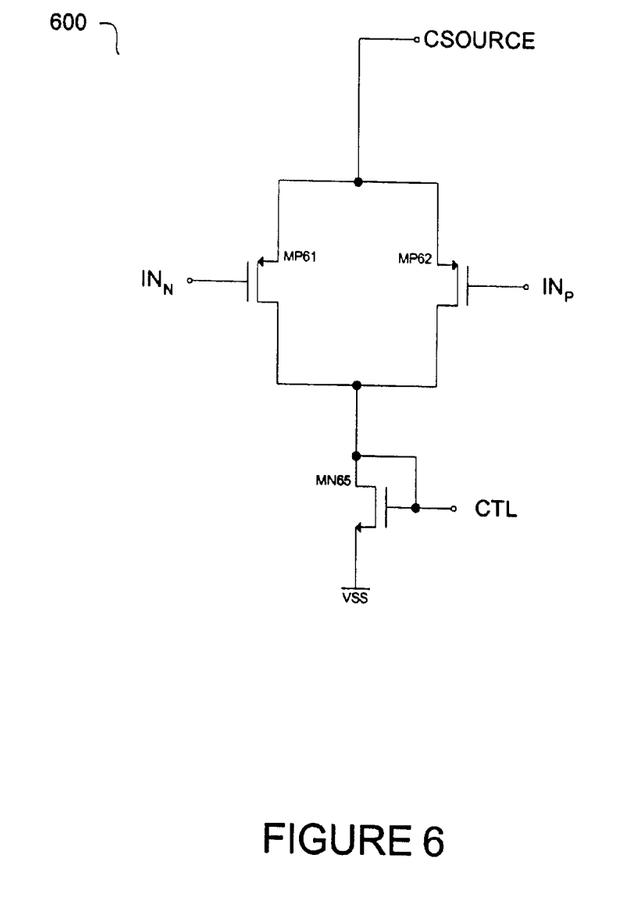
FIG. 6 is a schematic diagram of the first amplifier monitor circuit shown in FIG. 3.

FIG. 6 shows an example of a first amplifier monitor circuit (600) according to an embodiment of the present invention. A PMOS transistor (MP61) has a gate connected to the inverting input of the amplifier ($IN_N$), a drain connected to node CTL, and a source connected to node CSOURCE. Another PMOS transistor (MP62) has a gate connected to the non-inverting input of the amplifier ($IN_P$), a drain connected to node CTL, and a source connected to node CSOURCE. An NMOS transistor (MN54) has a drain and gate connected to node CTL and a source connected to $V_{SS}$. Transistor MP61 is sized to ratio with transistor MP41 in FIG. 4. Similarly, transistor MP62 is sized to ratio with transistor MP42 in FIG. 4. Transistor MN65 is sized to ratio with MN55 in FIG. 5.

Figure 7:
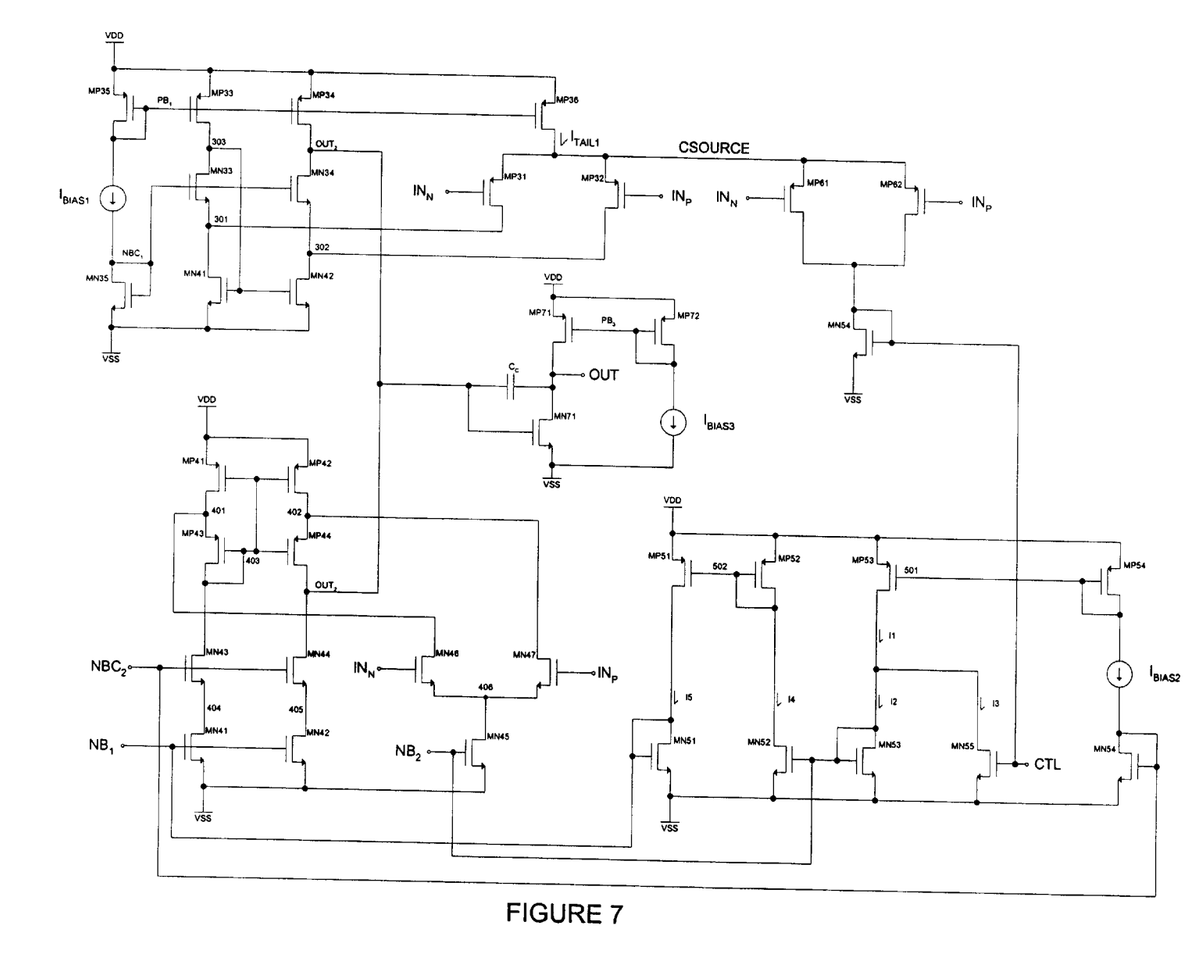
FIG. 7 is a schematic diagram of a rail-to-rail amplifier.

FIG. 7 shows a schematic diagram of a complete rail-to-rail amplifier in accordance with the present invention. The output ($OUT_1$) of the PMOS input stage amplifier (300, first input stage amplifier) is connected to the output ($OUT_2$) of the NMOS input stage amplifier (400, second input stage amplifier). The first amplifier monitor circuit (400) is connected to the PMOS input stage amplifier (400) and the bias circuit (500). A common source amplifier is coupled to the outputs of the trans-conductance amplifiers (OUT1, OUT2). The common source amplifier has an NMOS transistor (MN71), a compensation capacitor $C_C$, and a PMOS transistor (MP71). $C_C$ is connected between the gate and drain of MN71 providing Miller compensation to the amplifier. The drain of MN71 is connected to the output of the amplifier (OUT) and the drain of MP71. MP71 and MP72 form a PMOS current mirror. MP71 has a source connected to $V_{DD}$, and a gate connected to the $PB_3$ terminal. MP72 has a source connected to $V_{DD}$, and a gate and drain connected to $PB_3$. A current source $IBIAS_3$ provides a reference current for MP72/MP71, and may be an externally (off chip) or internally (on-chip) generated current.

The first amplifier monitor circuit (600) is arranged to produce a control signal (CTL) based on the state of operation of the first input stage amplifier. As stated previously, the first input stage amplifier has a PMOS differential input pair of transistors (MP31, MP32). When the voltage applied to the $IN_N$ and $IN_P$ input terminals reaches the $V_{DD}$ power supply (i.e. the common-mode voltage approaches $V_{DD}$), the PMOS input stage transistors (MP31, MP32) in FIGS. 3 and 7 will shut off since $V_{SG1}$ and $V_{SG2} < |V_{TP}|$. Transistors MP61 and MP62 share a common current source (410) connected to the CSOURCE node. Transistor MP61 and MP62 will shut off at the same input voltages as MP31 and MP32. Once transistors MP61 and MP62 shut off, the current flowing through transistor MN54 will drop to zero, and the control line CTL will drop to $V_{SS}$. As discussed previously, BIAS generator circuit (500) controls the bias lines to the NMOS input stage amplifier shown in FIG. 3.

The PMOS input amplifier (300) will operate with common-mode voltages near the $V_{SS}$ power supply, but not near the $V_{DD}$ power supply. Since NMOS devices are actively biased with a positive voltage, the NMOS input amplifier (400) will operate with common-mode voltages that approach the $V_{DD}$ power supply. By coupling the trans-conductance amplifier outputs together (See FIG. 7), the input stage of the total amplifier will operate with a rail-to-rail CMR.

By sensing the operating condition of the first input stage amplifier (300), and producing the bias voltage(s) for the second input stage amplifier (400) based on the operating condition, the NMOS and PMOS trans-conductance amplifiers are selectively enabled and disabled. Since the amplifiers (300,400) are not on at the same time, the overall gain of the input stage of the amplifier is given by the $g_m$ of one of the input stage amplifiers and the output stage amplifier. However, since the amplifiers are selectively enabled and disabled based on the common-mode voltage, it is possible to have one input stage amplifier active at a time (Neglecting a small range of operation where the first amplifier is barely operating and the second amplifier turns on). An amplifier that has two input stage amplifiers on at the same time would have twice the gain as compared to amplifiers using the above-described methods. Since, $GBW=g_m/(2*\pi*C_C)$, reducing the gain in half allows the compensation capacitor also be reduced in half while maintaining the same GBW product.

Although FIG. 7 shows a compensation capacitor, any appropriate compensation network may be used to compensate the amplifier. For example, a capacitor in series with a resistor may be used as the compensation network to reduce or eliminate the effects of parasitic poles in the amplifier. Other compensation networks, both active and passive, may be employed to compensate the amplifier's stability and responsiveness.

The above specification, examples and data provide a complete description of the manufacture and use of the composition of the invention. Since many embodiments of the invention can be made without departing from the spirit and scope of the invention, the invention resides in the claims hereinafter appended.

We claim:

1. An apparatus for amplifying a signal, comprising:

a first input stage amplifier;

a second input stage amplifier; and an input amplifier monitor circuit that senses an operating state of at least one of the first and the second input stage amplifiers to produce a control signal, wherein the control signal controls one of the first and second input stage amplifiers to limit a gain of the apparatus.

2. An apparatus as in claim 1, wherein the first input stage amplifier operates over a common-mode voltage is in a first range, and the second input stage amplifier is disabled when the common-mode voltage is in the first range such that the gain of the apparatus is limited.

3. An apparatus as in claim 1, further comprising a controller circuit, wherein the controller circuit disables the second amplifier in response to the control signal when the common-mode voltage is in a first range, and the controller circuit enables the second amplifier in response to the control signal when the common-mode voltage is in a second range.

4. An apparatus as in claim 1, further comprising a controlled bias circuit having a bias output that is coupled to the second input stage amplifier.

5. An apparatus as in claim 4, wherein the controlled bias circuit selectively disables the second input stage amplifiers by disabling the bias output in response to the control signal.

6. An apparatus as in claim 1, further comprising a first differential input pair of transistors is included in the first input stage amplifier, a second differential input pair of transistors is included in the input amplifier monitor circuit, the transistors of the first differential input pair and the second differential input pair are of a same type, and the second input stage amplifier is disabled by the control signal when the second differential input pair is operating at a common-mode voltage in a first range.

7. An apparatus as in claim 6, wherein the first differential input pair of transistors and the second differential input pair of transistors share a common current source.

8. An apparatus as in claim 1, wherein the first input stage amplifier is a trans-conductance amplifier having a first output, the second input stage amplifier is a trans-conductance amplifier having a second output, and the first output and second output are coupled to a common node.

9. An apparatus as in claim 8, further comprising a compensation network that is coupled to the common node such that the gain of the apparatus is compensated by the compensation network.

10. An apparatus as in claim 8, further comprising a compensation network including a capacitor, the compensation network is coupled to the common node such that the gain of the apparatus is compensated by the compensation network, whereby a size of the capacitor in the compensation network is reduced by limiting the gain of the apparatus.

11. An apparatus as in claim 1, wherein the input amplifier monitor circuit further comprises a current sense circuit and a differential pair of transistors, the current sense circuit produces the control signal responsive to current flowing in the differential pair of transistors.

12. An apparatus as in claim 1, further comprising a bias circuit that cooperates with the input amplifier monitor circuit to produce a bias voltage for the second input stage amplifier, wherein the bias voltage disables the second input stage amplifier when the first amplifier is operating.

13. An apparatus as in claim 1, further comprising a bias circuit producing a bias voltage for the second input stage amplifier, the bias circuit including: a first current source that generates a first current, a second current source that is controlled by the control signal to generate a second current, and a current sense circuit that senses a difference between the first current and the second current to produce the bias voltage.

14. An apparatus as in claim 1, wherein the input amplifier monitor circuit includes a current monitor circuit, wherein the current monitor circuit monitors a sample current from at least one of the first input stage amplifier and the second input stage amplifier, and the sample current is related to the control signal.

15. An apparatus as in claim 14, wherein the sample current changes as the input common-mode voltage approaches a power supply voltage, and the control signal changes when the sample current changes such that the first input stage amplifier is gradually disabled and the second input stage amplifier is gradually enabled such that the overall gain of the apparatus does not increase.

16. A method for amplifying a signal, comprising:

(a) gaining the signal with an amplifier to produce an output;

(b) gaining the signal with an other amplifier to produce an other output;

(c) combining the output with the other output to produce an other signal;

(d) amplifying the other signal to produce an amplified signal;

(e) disabling the other amplifier when the signal is in a common-mode voltage range where the amplifier is operable; and (f) enabling the other amplifier when the signal is in an other common-mode voltage range where the amplifier is inoperable, whereby an overall gain from the signal to the amplified signal is reduced.

17. A method for amplifying a signal as in claim 16, further comprising compensating the overall gain by coupling a compensation network between the other signal and the amplified signal.

18. A method for amplifying a signal as in claim 16, wherein disabling the other amplifier further includes sensing the condition of the amplifier to produce a control signal, and disabling a bias current in the other amplifier in response to the control signal such that the other amplifier is disabled by disabling the bias current.

19. An apparatus for amplifying a signal, comprising:
   (a) a first means for amplifying the signal;
   (b) a second means for amplifying the signal
   (c) means for sampling a current in the first means for amplifying;
   (d) means for disabling the second means for amplifying when the current is in a first range; and
   (e) means for enabling the second means for amplifying when the current is in a second range, whereby an overall gain in the apparatus is reduced.

20. An apparatus as in claim 19, further comprising means for limiting a gain of the apparatus, wherein the means for limiting the gain includes: a means for compensating, the means for disabling the second means for amplifying, and the means for enabling the second means for amplifying.

* * * * *